United States Patent [19]

Schinabeck et al.

[11] Patent Number: 4,646,299
[45] Date of Patent: Feb. 24, 1987

[54] METHOD AND APPARATUS FOR APPLYING AND MONITORING PROGRAMMED TEST SIGNALS DURING AUTOMATED TESTING OF ELECTRONIC CIRCUITS

[75] Inventors: John Schinabeck, Pleasanton; James R. Murdock, San Jose, both of Calif.

[73] Assignee: Fairchild Semiconductor Corporation, Cupertino, Calif.

[21] Appl. No.: 611,445

[22] Filed: May 17, 1984

Related U.S. Application Data

[63] Continuation-in-part of Ser. No. 518,499, Aug. 1, 1983, abandoned.

[51] Int. Cl.[4] ............................................. G01R 31/28
[52] U.S. Cl. ................................. 371/20; 324/73 R; 364/579; 371/25
[58] Field of Search ........................... 371/20, 25, 27; 324/73 R, 73 AT, 73 PC; 364/579, 580

[56] References Cited

U.S. PATENT DOCUMENTS

| | | | |
|---|---|---|---|
| 3,657,527 | 4/1972 | Kassabgi et al. | 371/25 |
| 4,044,244 | 8/1977 | Foreman et al. | 371/20 |
| 4,055,801 | 10/1977 | Pike et al. | 324/73 R |
| 4,070,565 | 1/1978 | Borreli | 371/20 |
| 4,092,589 | 5/1978 | Chau et al. | 324/73 R |
| 4,168,527 | 9/1979 | Winkler | 364/580 |
| 4,271,515 | 6/1981 | Axtell, III et al. | 371/25 |
| 4,439,858 | 3/1984 | Peterson | 371/20 |
| 4,517,512 | 5/1985 | Petrich et al. | 324/73 R |
| 4,523,312 | 6/1985 | Takeuchi | 371/25 X |

*Primary Examiner*—Charles E. Atkinson
*Attorney, Agent, or Firm*—Theodore S. Park; Bruce D. Riter; Robert C. Colwell

[57] ABSTRACT

A plurality of test signal applying and monitoring circuits are coupled to pins of an electronic device being tested to force test stimuli signals onto input pins of the device under test. The response signals are monitored while the device is being tested. Each test signal applying and monitoring circuit includes a node to be coupled to a pin of the device under test, a digitally programmed source for supplying a test signal connectable to the node by a first switch, and a comparison circuit connected to the node by a second switch for indicating the relative amplitude of the response signal with respect to a programmed reference level. The digitally programmed source is included for providing gated voltage-current crossover forcing functions during functional testing to minimize the disturbance when the device being tested is connected and to protect out of tolerance devices. Programmable voltage and current values define a pass window to assure a non-ambiguous go/no-go result during testing. Other features are also disclosed.

21 Claims, 5 Drawing Figures

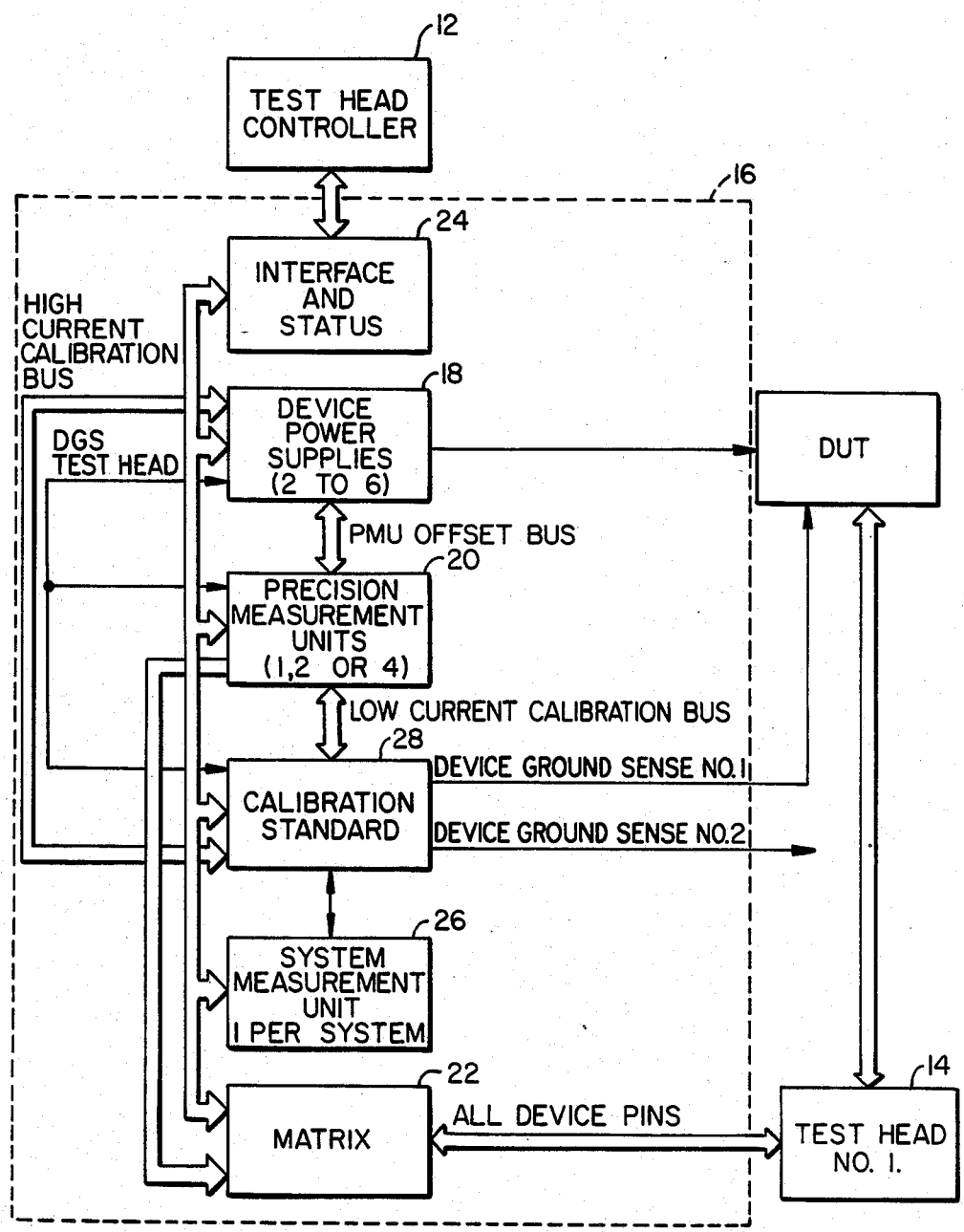
FIG._1.

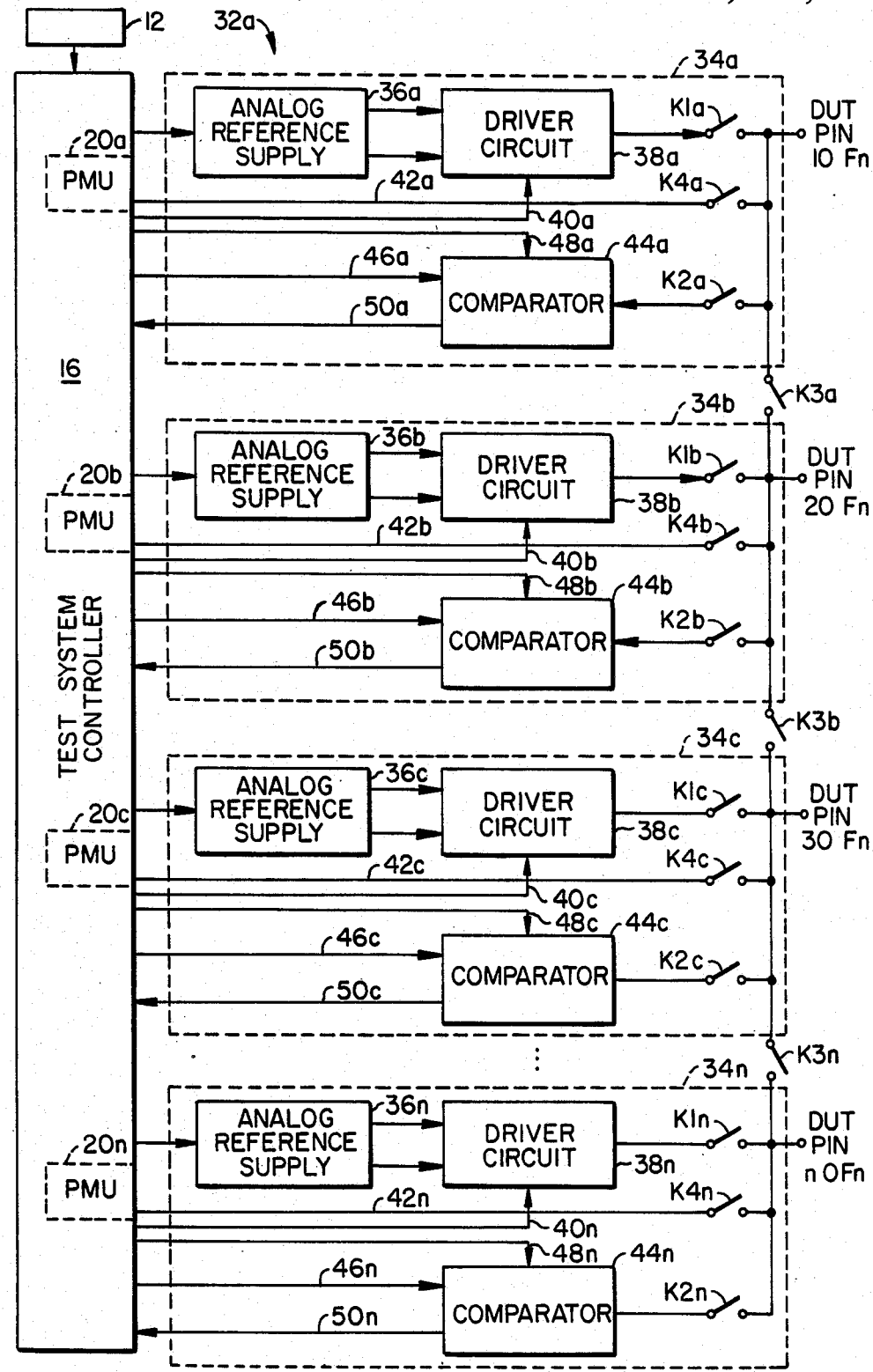
FIG._2.

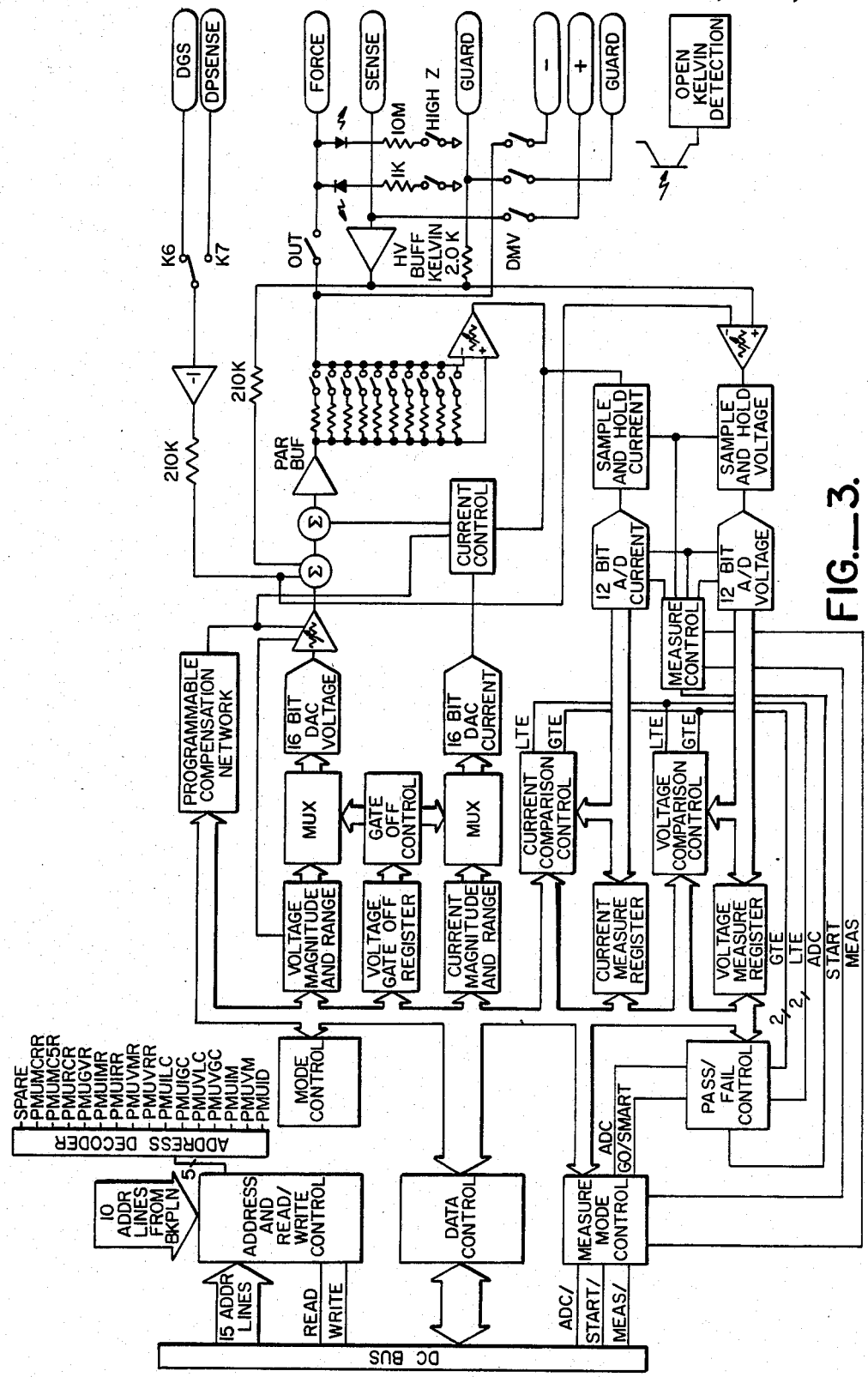
FIG._3.

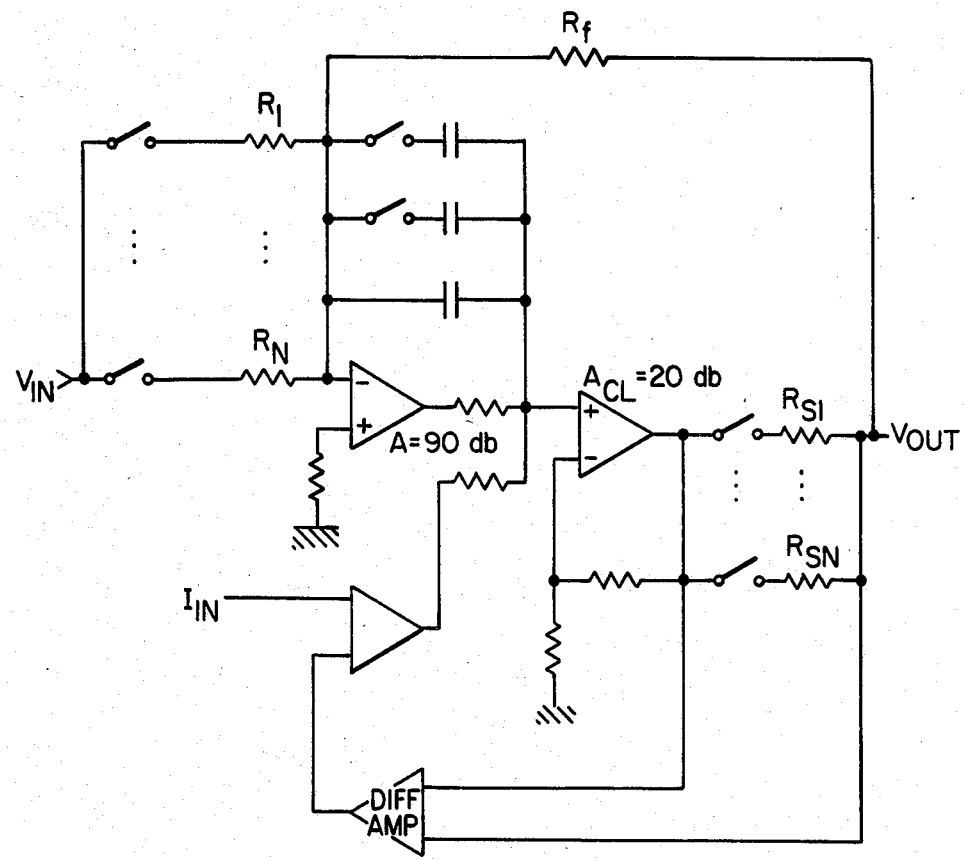
FIG._4.
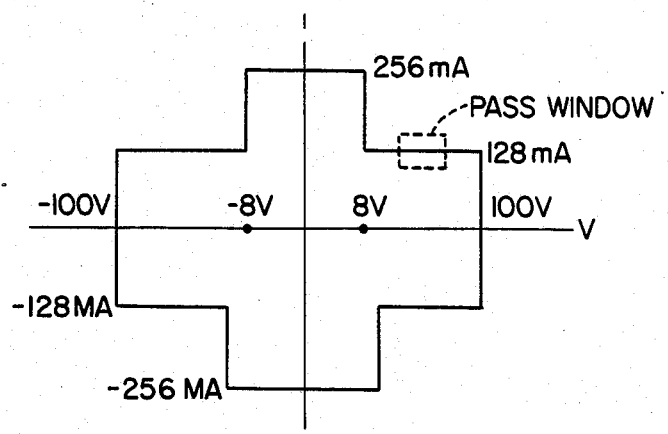
FIG._5.

METHOD AND APPARATUS FOR APPLYING AND MONITORING PROGRAMMED TEST SIGNALS DURING AUTOMATED TESTING OF ELECTRONIC CIRCUITS

CROSS-REFERENCE TO RELATED APPLICATION

This relates to the automated electronic test equipment disclosed in, and is a continuation-in-part of, the copending patent application of Richard F. Herlein, Rodolfo F. Garcia, Robert L. Hickling, Burnell G. West, Jamal Alrawi, Jeffrey A. Davis, John G. Campbell, Ronald L. Cline, E. J. Cotriss, John R. Schinabeck, and James R. Murdock, entitled HIGH SPEED TEST SYSTEM, U.S. Ser. No. 518,499, filed on Aug. 1, 1983, now abandoned, and assigned to the same assignee as this application. This also relates to the tester circuitry described in a copending patent application of John Schinabeck and James R. Murdock, entitled METHOD AND APPARATUS FOR MONITORING RESPONSE SIGNALS DURING AUTOMATED TESTING OF ELECTRONIC CIRCUITS, U.S. Ser. No. 06/611,448, and a copending patent application of John Schinabeck, entitled METHOD AND APPARATUS FOR MONITORING AUTOMATED TESTING OF ELECTRONIC CIRCUITS, U.S. Ser. No. 06/611,449, as well as copending patent applications U.S. Ser. No. 06/611,266, entitled TEMPERATURE STABILIZED GATE; U.S. Ser. No. 06/611,267, entitled TEST PERIOD GENERATOR FOR AUTOMATIC TEST EQUIPMENT; U.S. Ser. No. 06/611,446, entitled FORMATTER FOR HIGH SPEED TEST SYSTEM; U.S. Ser. No. 06/611,451, entitled METHOD AND APPARATUS FOR DYNAMICALLY CONTROLLING THE TIMING OF SIGNALS IN AUTOMATIC TEST SYSTEMS; U.S. Ser. No. 06/611,452, entitled GATE HAVING BALANCED NODE; U.S. Ser. No. 06/611,453, entitled CONTROL OF SIGNAL TIMING APPARATUS IN AUTOMATIC TEST SYSTEMS USING MINIMAL MEMORY; and U.S. Ser. No. 06/611,454, entitled MULTIPLE STAGE GATE NETWORK, all assigned to the same assignee.

BACKGROUND OF THE INVENTION

This invention relates to electronic circuits and, more particularly, to general purpose test systems capable of testing very large scale integrated (VLSI) circuits, including microprocessors, logic arrays, and multi-chip assemblies, at high speeds. Specifically, the invention is directed to a method and apparatus for automatically testing one or more electrical properties of a series of electronic circuits by applying and monitoring test signals during testing of the electronic circuits in an automated electronic test system.

In automated electronic test equipment, one or more electrical signal sources is coupled to the pins or other nodes at the inputs of an electronic device being tested to force stimuli signals controlled by a test system computer onto the device under test, and the resultant conditions at the outputs of the device being tested are monitored. Typically, the stimuli signals represent logic states or analog voltages or currents which are applied in a parallel pattern to the input pins of the device under test, and the resulting output pattern is checked in parallel.

The signal sources apply stimuli signals to the device under test through pin electronics interface circuits which function as computer controlled interface circuits between the computer of the test system and the individual pins of the device being tested. The pin electronics interface circuits receive these stimuli signals and then through input drivers included in the pin electronics interface circuits switch these stimuli signals onto the desired input pins of the device under test in accordance with a stored program in the test system. The pin electronics interface circuits also receive reference voltages or currents which comparator circuits included in the pin electronics interface circuits compare to the voltages or currents received from the output pins of the device being tested. The output signals from the comparator circuits are returned to the test system computer where they are checked in accordance with a stored program for the proper responses. In this manner, electronic components, for example, semiconductor memories or other integrated circuits, can be individually tested to assure that they meet whatever standard or specifications the ultimate user of the integrated circuit desires.

Considered in more detail, known static measurement circuitry has a single voltage or current force mode programmable precision measurement unit connected to the input pins of the device being tested via a relay matrix included in the pin electronics interface circuits. Single limit analog comparison techniques are typically used for go/no-go measurement speed. Measured value results are generally acquired via a software search routine. In some automated electronic test equipment, the constant voltage signal source can be reconfigured for constant current operation. Mode reconfiguration switching and low current ranges typically limit analog speed to that required to maintain stable operation with a maximum specified capacitive load. One disadvantage in the operation of such automated electronic test equipment, however, is the voltage transients caused by reconfiguration which result in disturbances in the operation of the automated electronic test equipment. Relay switching during configuration change while connected to the device under test causes aberrations due to the disturbances caused by the voltage transients.

Bias supplies used as the signal sources have traditionally been digitally programmed bipolar operational power amplifiers. Another disadvantage in the operation of such automated electronic test equipment, however, is the destruction of the evidence of failure of the device under test.

Some form of voltage clamping is typically provided in the current force mode to protect the device being tested from compliance voltage, but only when sequencing the precision measurement unit connection from one input pin to the next. Programmable current clamps are occasionally included, but the only limit on power delivered to the load is typically a hardware self protect mechanism.

As circuits increase in density and gate count, they become more of a power sink or load source. This causes concern when the device under test has a tendency toward short circuit if the device is defective. The automated electronic test equipment can destroy the evidence of failure.

While known precision measurement units have some capability to respond to sudden current demand changes, their worst case compensated slow dynamic response can cause damaging transients to occur. Sensing of an out of tolerance condition when a device being tested is powered up provides the desired early fail indication, but without fast power limiting, destruction of fail evidence and/or the device under test to precision measurement unit connection path can result.

SUMMARY OF THE INVENTION

The present invention provides a method and apparatus for applying static analog voltages or currents to pins of a device under test and monitoring or measuring resulting currents or voltages so as to evaluate the responses of the device being tested. The invention provides an automatic crossover forcing function for supplying test signals to provide a minimum disturbance when the device being tested is connected and to protect against destruction of the evidence of failure when the device under test is out of tolerance, that is, defective. The invention also provides programmable voltage and current values which define a pass window to assure a non-ambiguous go/no-go result during testing.

According to this invention, a method and apparatus are provided for automatically applying and monitoring forcing functions to a device being tested. The method and apparatus in accordance with the invention provide gated voltage-current crossover forcing functions for test signals. This provides a minimum disturbance when the device under test is connected.

The invention provides a method for applying and monitoring a test signal at a node of a device under test including digitally programmed source means having a preselected programmed voltage-current characteristic defined by not-to-exceed voltage rail and current rail levels switchably connected by a first switch means to the node for supplying a test signal to the node and comparison means switchably connected by a second switch means to the node. The method comprises the steps of: connecting the test signal to the node; comparing the test signal with a preselected programmed reference level; providing an indication of the relative magnitude of the test signal with respect to the preselected programmed reference level; and providing a preselected programmed constant signal in the event that the test signal has a predetermined relationship with respect to the preselected programmed reference level.

Preferably, the step of comparing the test signal with a preselected programmed reference level comprises comparing the voltage applied to the node with the preselected programmed voltage rail level, the step of providing an indication of the relative magnitude of the test signal with respect to the preselected programmed reference level comprises providing an indication of the relative magnitude of the voltage applied to the node with respect to the voltage rail level, and the step of providing a preselected programmed constant signal in the event that the test signal has a predetermined relationship with respect to the preselected programmed reference level comprises applying the preselected programmed current rail level when the voltage applied to the node reaches the voltage rail level. Preferably, the test signal is a forcing function which starts at zero volts and one percent of the maximum current of a preselected voltage-current range. Alternatively, the step of comparing the test signal with a preselected programmed reference level comprises comparing the current at the node with the preselected programmed current rail level, the step of providing an indication of the relative magnitude of the test signal with respect to the preselected programmed reference level comprises providing an indication of the relative magnitude of the current at the node with respect to the current rail level, and the step of providing a preselected programmed constant signal in the event that the test signal has a predetermined relationship with respect to the preselected programmed reference level comprises applying the preselected programmed voltage rail level when the current at the node reaches the current rail level.

In accordance with another aspect of the invention, an embodiment of apparatus for applying and monitoring a test signal to a node of a device under test is provided. The apparatus comprises: digitally programmed source means switchably connected by a first switch means to the node, the digitally programmed source means having a preselected programmed voltage-current characteristic defined by not-to-exceed voltage rail and current rail levels for supplying test signals and alternatively a preselected programmed constant signal to the node; and comparison means switchably connected by a second switch means to the node for indicating the relative magnitude of the test signal with respect to a preselected programmed reference level; the digitally programmed source means supplying the test signals unless the test signal applied has a predetermined relationship with respect to the preselected programmed reference level; the digitally programmed source means supplying the preselected programmed constant signal in the event that the applied test signal has a predetermined relationship with respect to the preselected programmed reference level.

Preferably, the comparison means compares the voltage applied to the node with the preselected programmed voltage rail level for providing an indication of the relative magnitude of the voltage applied to the node with respect to the voltage rail level; the digitally programmed source means supplying the test signals unless the voltage applied to the node reaches the voltage rail level; the digitally programmed source means supplying the preselected programmed current rail level when the voltage applied to the node reaches the voltage rail level. Preferably, the digitally programmed source means is a crossover source which supplies a test signal in the form of a forcing function that starts at zero volts and one percent of the maximum current of a preselected voltage-current range. Alternatively, the comparison means compares the current at the node with the preselected programmed current rail level for providing an indication of the relative magnitude of the current at the node with respect to the current rail level; the digitally programmed source means supplying the test signals unless the current at the node reaches the current rail level; the digitally programmed source means supplying the preselected programmed voltage rail level when the current at the node reaches the current rail level.

Additionally, the invention provides a method for monitoring the response signal at a node of a device under test caused by a test signal applied to the node by digitally programmed source means having a preselected programmed voltage-current characteristic defined by not-to-exceed voltage rail and current rail levels switchably connected by a first switch means to the node and comparison means switchably connected by a second switch means to the node. The method comprises the steps of: connecting the test signal to the node; comparing the response signal voltage at the node with a first preselected programmed voltage level; comparing the response signal voltage at the node with a second preselected programmed voltage level; comparing the response signal current at the node with a first preselected programmed current level; comparing the response signal current at the node with a second preselected programmed current level; providing an indication of the relative amplitude of the response signal voltage and current with respect to the first and second preselected programmed voltage levels and first and second preselected programmed current levels, respectively; providing a pass signal when the response signal voltage and current have a first predetermined relationship with respect to the first and second preselected programmed voltage levels and first and second preselected programmed current levels, respectively; and providing a fail signal when the response signal voltage and current have a second predetermined relationship with respect to the first and second preselected programmed voltage levels and first and second preselected programmed current levels, respectively; thereby providing a non-ambiguous pass/fail result. Preferably, the test signal is a forcing function which starts at zero volts and one percent of the maximum current of a preselected voltage-current range.

Furthermore, the invention provides apparatus for monitoring the response signal at a node of a device under test caused by a test signal applied to the node. The apparatus comprises: digitally programmed source means switchably connected by a first switch means to the node, the digitally programmed source means having a preselected programmed voltage-current characteristic defined by not-to-exceed voltage rail and current rail levels for supplying test signals to the node; first comparison means switchably connected by a second switch means to the node for indicating the relative amplitude of the response signal voltage at the node with respect to a first preselected programmed voltage level; second comparison means switchably connected by the second switch means to the node for indicating the relative amplitude of the response signal voltage at the node with respect to a second preselected programmed voltage level; third comparison means switchably connected by the second switch means to the node for indicating the relative amplitude of the response signal current at the node with respect to a first preselected programmed current level; fourth comparison means switchably connected by the second switch means to the node for indicating the relative amplitude of the response signal current at the node with respect to a second preselected programmed current level; means for providing a pass signal when the response signal voltage and current have a first predetermined relationship with respect to the first and second preselected programmed voltage levels and first and second preselected programmed current levels, respectively; and means for providing a fail signal when the response signal voltage and current have a second predetermined relationship with respect to the first and second preselected programmed voltage levels and first and second preselected programmed current levels, respectively; whereby a non-ambiguous pass/fail result is provided. Preferably, the digitally programmed source means is a crossover source which supplies a test signal in the form of a forcing function that starts at zero volts and one percent of the maximum current of a preselected voltage-current range.

The digitally programmed source provides a gated, automatic crossover type forcing function. Since the device under test can present a power sink or source load, a four-quadrant operation is provided.

The digitally programmed source can be gated on and off. Voltage and current are independently gated to provide a minimum disturbance connect-disconnect condition with dry switching of relays. This allows direct connection of the Kelvin force and sense paths to a load board point near the pin of the device under test to be biased without a relay disconnect provision. The idle (gate-off) state is preferably forcing zero volts with current rails set at one percent of full scale in the last programmed range.

The digitally programmed source is programmed with signed values of voltage and current to define two calibrated operating rails in the intended operating quadrant. An equal valued uncalibrated current rail in the opposite quadrant is automatically set by the circuitry to limit maximum power that can be delivered to the device being tested. The connected device under test load determines a stable operating point (typically on the calibrated current or voltage rail) which can be digitized by on-board analog-to-digital converters after a programmed settling delay. On-board analog-to-digital converters provide simultaneous conversions of the voltage and current operating point. The dynamic characteristics are under program control to optimize test system throughput. Program selected rolloff allows the test plan to control optimum speed for each test condition.

The force lines can be open circuited by a relay under program control. In this configuration, the sense input can be routed as a high impedance voltmeter probe via the connect paths. The dedicated voltage and current analog-to-digital converters can digitize measurements and return the values for software use. Also, four voltage and current limit registers can be loaded to define a pass window, and the measurements can be compared to these programmed high and/or low limits to return a direct pass/fail result.

A four-quadrant, automatic crossover test signal source is provided which is programmed in both current and voltage. When the test signal source is connected to the device under test, the resulting load determines a stable operating point on the programmed constant voltage or current rail. Thus, the maximum power delivered is controlled by the test plan, rather than by clamp type protection mechanisms or a test system self protect mechanism.

The method and apparatus in accordance with the invention allow a minimum disturbance connection to the device under test and limit the power delivered to a defective device being tested so as not to destroy the evidence of failure. On-board analog-to-digital converters are provided for measured value results of the test signal source operating point voltage and current which are preferably compared against programmed reference levels or limit values for a pass/fail condition. This provides a more sensitive indication when abnormal current demand change occurs during functional testing. The method and apparatus in accordance with the invention can be used for engineering characterization, production testing, incoming inspection, and quality assurance of complex integrated circuits, such as VLSI circuits.

BRIEF DESCRIPTION OF THE DRAWINGS

The above and other features of the invention and the concomitant advantages will be better understood and appreciated by those skilled in the art in view of the description of the preferred embodiments given below in conjunction with the accompanying drawings. In the drawings:

FIG. 1 is a block diagram of a test system fabricated according to the invention;

FIG. 2 is a more detailed block diagram of the testing circuit of this invention;

FIG. 3 is a schematic circuit diagram of the precision measurement units included in the testing circuit shown in FIG. 2;

FIG. 4 is a detailed schematic circuit diagram of the analog circuitry included in the digitally programmed sources of the precision measurement units included in the testing circuit shown in FIG. 2; and FIG. 5 illustrates the voltage-current characteristics of the digitally programmed sources of the precision measurement units included in the testing circuit shown in FIG. 2.

DESCRIPTION OF THE PREFERRED EMBODIMENTS

FIG. 1 is a block diagram of a test system fabricated according to this invention. Shown in FIG. 1 is a test head controller 12. The test head controller 12 is preferably implemented with a dedicated 68000 microprocessor manufactured by Motorola Inc. of Phoenix, Ariz. coupled with program and data random access memory (RAM) and 16 Kilobytes of bootstrap programmable read only memory (PROM). The test head controller 12 transmits control data and receives subsystem status reports, interrupt requests, and test data. The test head controller 12 is responsible for all communications between the test program and the testing circuit, with the exception of the down loading of test vectors which are handled by a test vector store (not shown). One test head controller 12 is provided for each test head 14.

Each test head controller 12 interfaces to a direct current (DC) subsystem 16 associated with the test head 14. One dedicated DC subsystem 16 is preferably provided for each test head 14. Output to the test head 14 is timed-formatted drive data (for inputs) and expect data and strobe timing (for outputs). Information received from the test head 14 is pass/fail data resulting from output comparisons.

The major functional components of the DC subsystem 16 include: two to six device power supplies 18 used to supply static bias power to the device under test (DUT); one, two, or four precision measurement units (PMU's) 20 for voltage and current test stimulus and DUT static parameter measurements or limit tests; a guarded Kelvin relay matrix 22 for interconnection of the PMU's to the test head 14; an interface bus 24 to transfer control and status information between the DC subsystem and the dedicated test head controller 12; and a system measurement unit 26 and calibration standard circuit 28 used for automatic calibration of the test head and DC subsystem.

The DC subsystem 16 preferably includes the system measurement unit 26 and calibration standard circuit 28 for automatic test system calibration. The calibration standard circuit 28 has National Bureau of Standards traceable precision voltages and resistances that are used in conjunction with the system measurement unit 26 to automatically calibrate the test head 14 and DC subsystem 16 analog voltages. There is preferably one system measurement unit 26 and calibration standard circuit 28 in each test system, and they can be shared by as many as two DC subsystems 16 if two test stations are present.

The test system is configured in a modular fashion and can be expanded on a functional basis (more device power supplies 18 or PMU's 20) or by adding an additional test head 14. The DC subsystem 16 includes the device power supplies 18 and PMU's 20 for DC parametric tests. Each DC subsystem 16 can be configured with a varying number of device power supplies 18 and PMU's 20 to suit the individual DUT testing needs.

The DC subsystem 16 preferably includes a minimum of two device power supplies 18. Additional device power supplies 18 can be added, in increments of two, for a maximum of six device power supplies per DC subsystem 16. The device power supplies 18 provide high current (eight ampere) capability and swings of up to 32 volts (V) to supply the current requirements of the largest bipolar gate arrays.

One PMU 20 is included in the DC subsystem 16, and additional PMU's can be added to a maximum of four. Simultaneous use of four PMU's 20 results in increased speed for faster DC parametric tests. The PMU's 20, in contrast to the device power supplies 18, provide high voltage and high current (100 V/256 milliamperes) at high accuracy and can be connected to all pins of the DUT. Each PMU 20 can make measurements relative to device ground, or relative to any of the device power supplies 18 for such tests as $V_{OH}$.

The PMU's 20 are connected by the relay matrix 22 to the test head 14 and via a plurality of pin electronics interface circuits included in the test head to the DUT as will be described in conjunction with FIG. 2. The PMU's 20 shown in FIG. 1 provide precision DC parameter tests over a greater range of current and voltage than is provided by per pin tests via the pin electronics interface circuits. Each pin electronics interface circuit includes circuitry for four DUT pins. All four channels are identical, and all are full input/output (I/O) channels.

The test system can support one or two test heads 14, either a 128-pin configuration or a 256-pin configuration. The test head 14 is expandable from a 64-pin base in 32-pin increments. The test head 14 comprises the pin electronics interface circuit drivers, pin electronics interface circuit comparators, programmable current load, pin electronics interface circuit relays, pin electronics interface circuit reference generators, per pin measurement circuitry, and DUT interface circuitry. Each channel has: a two-level driver with a high impedance (off) state; four-level comparators for V high, V low, and V intermediate pairs; and a low-capacitance programmable load that is also capable of providing a 50-ohm termination for ECL device testing with a low reflection coefficient.

The drivers, comparators, and programmable loads have dedicated digital-to-analog converters (DAC's), a total of nine DAC's per pin for complete flexibility. This flexibility provides programming ease and mixed-mode logic on multi-chip assemblies. This flexibility is a key to maintaining DC accuracy with automatic calibration compared to known automated electronic test equipment.

The relay matrix 22 is a high-quality, low-leakage relay matrix used to switch outputs from the PMU's 20 to the DUT via the pin electronics interface circuits and allows force, sense, and guard lines of the PMU's to be connected to any pin of the DUT. The relay matrix 22 is configured to allow access to all pins in a test system with one PMU 20. In a test system with two PMU's 20, all odd pins are preferably connected to PMU 1, and all even pins are connected to PMU 2. In a test system with four PMU's 20, the pins are preferably connected to the PMU's in a modulo-four manner, i.e., PMU 0 to pins 0, 4, 8 . . . , PMU 1 to pins 1, 5, 9 . . . , PMU 2 to pins 2, 6, 10 . . . , and PMU 3 to pins 3, 7, 11 . . . The relay matrix 22, however, can be reconfigured so that any PMU 20 can be assigned as 0 or 1 to allow reassignment and continued testing if one PMU fails. The device power supply 18 high-sense lines and device ground sense are also relay switched to the PMU 20 low-sense lines for PMU offsetting and effective differential measurements. The interface bus 24 is the communication circuit between the DC subsystem 16 and test head controller 12 over which the DC subsystem receives information from and sends information to the test head controller.

The test system uses dedicated DC subsystem circuitry for each test head 14. Thus, while DC tests are being executed at one test station, either functional or DC testing can occur simultaneously at the optional second test station. These tests are independently controlled by the dedicated test head controller 12.

On the one hand, the device power supplies 18, which form a high voltage test station, allow each test pin, under the control of programmed instructions, to be assigned as a bias supply. The force and measure amplitudes handled by the device power supplies 18 are greater than those handled by the test head controller 12 and PMU's 20, but such speed considerations as rise and fall time are necessarily slower. The device power supplies 18 shown in the testing circuit of FIG. 1 are described more fully in the copending patent application of John Schinabeck, and entitled METHOD AND APPARATUS FOR MONITORING AUTOMATED TESTING OF ELECTRONIC CIRCUITS, U.S. Ser. No. 06/611,449, filed on the same date as this application and assigned to the same assignee, and the disclosure is hereby incorporated by reference.

On the other hand, the test head controller 12 and the PMU's 20 allow DC parameter tests. The test head controller 12 and PMU's 20 include the capability for each active test pin, under the control of programmed instructions, to be assigned as an input driver, output comparator, or I/O pin. A timing module offers timing edge resolution, which allows the user to accurately place edges when measuring the alternating current (AC) parameters of a high speed DUT. The test rate is programmable. The uninterrupted flow of timed test vectors between the test head controller 12 and the DUT emulates combinations to which the DUT would be subjected in its intended application.

The test system shown in the block diagram of FIG. 1 is described more fully in the aforementioned patent application of Herlein et al., entitled HIGH SPEED TEST SYSTEM (U.S. Ser. No. 518,499 filed on Aug. 1, 1983, now abandoned). The disclosure of the U.S. Ser. No. 518,499 (Aug. 1, 1983) application of Herlein et al. is hereby incorporated by reference.

FIG. 2 is a more detailed block diagram of a portion of each test signal applying and monitoring circuit 32 in accordance with this invention. As shown in FIG. 2, a test signal applying and monitoring circuit 32a communicates with the test head controller 12 via the interface bus 24. The test head controller 12 controls the pattern of test signals applied to the DUT by the test signal applying and monitoring circuit 32a. Several registers within the test head controller 12 allow control of each DUT pin while testing at the programmed rate.

The test signal applying and monitoring circuit 32a includes a plurality of pin electronics interface circuits 34a, 34b, 34c, . . . 34n connected to n pins of the DUT. Preferably, one pin electronics interface circuit 34 is connected to each terminal of the multi-terminal DUT. Each pin electronics interface circuit 34 is capable of being operated by the test head controller 12 in one of several modes depending upon whether the pin electronics interface circuit is coupled to a DUT input signal terminal, DUT output signal terminal, or other various function or supply terminals. Thus, a DUT having sixteen terminals or pins is tested in a fixture containing sixteen identical pin electronics interface circuits 34 controlled by a single test head controller 12 containing a stored program specifically written to test the particular DUT.

For example, to functionally test a signal input terminal of the DUT, the test head controller 12 closes a relay contact K1a, for example, a reed relay contact, included in the pin electronics interface circuit 34a to connect the test stimuli section of the test signal applying and monitoring circuit 32a to pin 1 of the DUT. This section of the test signal applying and monitoring circuit 32a includes an analog reference supply 36a which in response to signals from the test head controller 12 generated according to a program stored in the test system computer produces two levels of direct current reference signals. These two reference signals are applied to a driver circuit 38a which biases the DUT between the two reference signals to produce a pattern of pulses for functional testing in accordance with data supplied to the driver circuit on a line 40a.

The test signal applying and monitoring circuit 32a is also capable of performing parametric tests on the DUT. As will be described in greater detail, the test signal applying and monitoring circuit 32a in accordance with the invention is particularly directed to parametric tests on the DUT. During one case of such testing, the PMU 20a located within the DC subsystem 16 supplies desired voltages or currents to the appropriate pin of the DUT. In such operation, the test head controller 12 closes only relay contact K4a, for example, a reed relay contact, to enable coupling of pin 1 of the DUT to the PMU 20a via a line 42a. Similar PMU's 20b, 20c, . . . 20n can apply controlled test signals to corresponding other pins of the DUT, or one or more PMU's can be multiplexed to the pins.

For quantitative voltage or current measurement, each PMU 20 can be used to apply (force) a precision program specified voltage or current to any desired pin of the DUT. Each PMU 20 preferably provides force and measurement ranges up to +100 volts (V) and 256 milliamperes (mA).

In accordance with the invention, each PMU 20 includes a digitally programmed source which provides a gated, automatic crossover type forcing function. Since the DUT can present a power sink or source load to a connected PMU 20, four-quadrant operation is preferably provided. The digitally programmed source included in each PMU 20 can be gated on and off. Voltage and current are independently gated to provide a minimum disturbance connect-disconnect condition with dry switching of relays.

The idle (gate off) state is preferably forcing zero volts with current rails set at one percent of the last programmed range. Program selected rolloff allows the test plan to control optimum speed for each test condition.

The test head controller 12 can close a relay contact K2a, for example, a reed relay contact, so that the test signal from the PMU 20a coupled to the signal input terminal of the DUT is applied directly to a comparison means 44a. The comparison means 44a included in the PMU 20a preferably comprises on-board analog-to-digital converters (ADC's) for simultaneous conversions of the voltage and current operating point. The comparison means 44a can also receive a predicted signal from the test head controller 12 via a line 46a. Consequently, the output signals from the comparison means 44a can change in accordance with the test signal applied to the DUT.

In addition, a data input signal can be transmitted by the test head controller 12 to the comparison means 44a through a line 48a to switch the output signals from the comparison means. The output signal from the comparison means 44a is returned to the test head controller 12 via a line 50a. The output signal from the comparison means 44a on the line 50a can cause the test head controller 12 to register either acceptance or rejection of the DUT, or to specify its quality.

FIG. 3 is a more detailed schematic circuit diagram of a portion of each of the test signal applying and monitoring circuits 32 in accordance with the invention. Each PMU 20 includes a digitally programmed source which provides a four-quadrant, gated current or voltage forcing function. The PMU 20 is a programmable precision voltage or current supply which can force a constant voltage or clamp to a constant current. Each PMU 20 also includes on-board comparison means 44 in the form of analog-to-digital converters (ADC's) for simultaneous measurement of the voltage and current operating point. The PMU 20 can be referenced to device ground sense (DGS) or any device power supply 18 in the same DC subsystem 16. This load current or voltage can be measured with an ADC and read back for a numerical result or compared against a programmed limit value for a pass/fail condition.

The PMU 20 can be used either as a high impedance voltmeter or an ammeter to accurately measure both voltage and current at any pin of the DUT simultaneously. While each PMU 20 can either force voltage or current, the PMU can simultaneously measure both voltage and current output to the DUT. The PMU 20 is calibrated by the system measurement unit 26 and calibration standard circuit 28.

The PMU 20 can be connected differentially and measure between any pin and DGS or between any pin and the high sense line of any device power supply 18. The PMU 20 can make measurements in three modes: (1) measurement mode; (2) analog settling analysis mode; and (3) go/no-go measurement mode.

The PMU 20 is an extremely flexible power supply with the capability of being fully programmable, with respect to both voltage and current, and having the ability to program the response characteristic time to optimize the test time. As shown in FIG. 3, all input and output signals are through edge connectors to the DC subsystem 16 backplane. There are 16 data lines and 15 address lines supplied from the pin electronics interface circuit board. The analog inputs and outputs can be disconnected from the backplane by relays included in the PMU 20.

There are two 16-bit digital-to-analog converters (DAC's) included in the PMU 20, one for forcing voltage and one for forcing current. The outputs of these DAC's are used together to provide control over the forcing and clamping circuitry. The measurement ability of the PMU 20 is performed by two 12-bit ADC's and the measurement control circuitry. All functions of the PMU 20 are externally programmable by the user.

The PMU 20 includes a digital section, starting with the address decoder block. The primary function of this block is to decode the board and the register selects. There are 14 separate registers included in each PMU 20. The board select and individual register selects are decoded from the 10 address lines from the backplane (built into the backplane) and the 15 address lines sent to each PMU 20 from the interface bus 24 included in the DC subsystem 16.

The PMU 20 also includes an address and read/write control block. This block contains the address interface and the read/write control circuitry. Inputs to this block are the read and write signals from the interface bus 24 included in the DC subsystem 16 and the 15 address lines from the interface bus 24 included in the DC subsystem 16. Each PMU 20 has a separate identification (ID) register. This register contains the identification code for the board and the register for the status indicators for the board. The following description is of the ID register: bit 0 is always 1 and indicates whether a circuit board is plugged in or not. This bit is a read only bit. Bits 1-5 contain the assembly revision number. Bits 6-13 are not used. Bit 14 controls an amber LED for diagnostics display and is a read/write bit. Bit 15 controls a red LED for diagnostics display and is a read/write bit. The LED codes are shown in TABLE I.

TABLE I

| LED CHART | |
|---|---|
| AMBER | Untested |
| AMBER/RED | One of several in a failure test |
| RED | Faulty module |
| ALL OFF | Ready for use |

The data control block is a bidirectional data bus which allows communications between the PMU 20 and the interface bus 24 included in the DC subsystem 16. The data bus is 16 bits wide and common to all registers included in the PMU 20.

Various blocks are associated with the voltage and current DAC's. The voltage magnitude and range and the current magnitude and range are functionally identical, with the results being the digital control of the respective DAC's. However, the mux blocks must already be in the gate-on condition. If the gate-off condition is in effect, then the inputs to the DAC's are from the gate-off control block. In the gate-off mode, the voltage DAC is programmed to an uncalibrated zero volts. The current DAC is programmed to one percent of range. There are separate gate on/off controls for voltage and current, thereby allowing flexibility in the output conditions of the PMU 20.

The analog section is divided into three major sections. First is the forcing circuitry, second is the clamping circuitry, and finally the measure circuitry.

The forcing circuitry comprises the following sections: 16-bit voltage DAC (dependent on mode); 16-bit current DAC (dependent on mode); summing nodes; power buffer; current range resistor network; and high voltage buffer (sense). In the voltage force mode, the 16-bit voltage DAC supplies the correct potential to the summing point via the variable gain amplifier. The amplifier is voltage range dependent. This amplifier can also be compensated to optimize the test conditions to increase throughput in the production environment. The compensation consists of changing the response time and therefore increasing or decreasing the bandwidth of the circuit, at the expense of reducing capacitive load. At the first summing point, the DAC voltage is referenced to the input signal PREF which has its own inverting unity gain buffer. This allows the PMU 20 to be referenced to the device power supply 18 sense line. At the first summing point, the feedback from the high voltage sense buffer is also summed. The output is summed in the second summing point with the output optimized to increase throughput. The output of the second summing point is fed to the input of the high power buffer. The output of the buffer then goes through the current ranging resistors and through the output relay to the force line coupled to the matrix board. At the test head 14, the force line is tied to the sense line, and the forced voltage is present at the input of the high voltage sense buffer. The output of the sense buffer feeds back through a feedback resistor to the first summing point, thereby completing the forcing loop.

In the current force mode, the 16-bit current DAC supplies the correct potential to the current control block. The other input to this block is from the current monitoring amplifier that senses the current through the current range resistors. The output of the current control block is fed to the second summing point to combine with the voltage that is sent from the voltage DAC. As the current forcing value is reached, the current control block starts limiting any further increase in current. Otherwise, the output voltage would drop proportionately.

The clamping circuitry comprises the following blocks: current monitor buffer; current control block; current ranging resistors; and 16-bit current DAC. To force a voltage and clamp at a specific current level the voltage magnitude and range and current magnitude and range must be initially set up (proper output connections are assumed).

If the load resistance is low enough to cause more current to flow through the current ranging resistors than has been programmed into the current DAC, then the current control circuitry reacts to this condition and reduces the output voltage accordingly so that the current through the ranging resistors decreases to the limit set into the current magnitude DAC. This is also the same procedure for forcing current.

The analog circuitry starts at the DAC outputs. The circuit is a precision voltage amplifier with high current capability. However, the amplifier switches to a precision current source whenever the load current exceeds a programmed limit. A block diagram of the amplifier is shown in FIG. 4. The operation will be discussed in two phases: (a) operation as a voltage amplifier; and (b) operation in current clamp.

The voltage amplifier is a feedback amplifier whose gain is primarily dependent on external components. The closed loop gain of this amplifier, V out/V in, is equal to Rf/Rn (Rn is one of the input resistors which is switched in to set the voltage range). The DC open loop gain is high enough (greater than 100 dB) to assure the accuracy of the closed loop gain. The first stage of the amplifier is a ua 356. This stage is connected as an integrator to provide a dominant pole for the loop. The capacitor from output to input sets the loop bandwidth and thereby the settling time for the amplifier. Two additional capacitors can be switched in to maintain stable operation when capacitive loading is heavy.

The second stage is a discrete amplifier with ±256 mA drive capability. The gain of this stage is also controlled by feedback resistors and is set at 20 dB.

As long as load current does not exceed the programmed limit, the current clamp does not affect circuit operation. Load current is constantly monitored via a current sense resistor, Rsn, at the output of the voltage amplifier. Whenever the current through Rsn exceeds the programmed value, the first stage of the voltage amplifier is forced into cutoff, and a current driver integrator controls the closed loop operation.

The last section is the measure circuitry. The following blocks comprise the measure circuitry: measure mode control; pass/fail control; measure control; current measure register; voltage measure register; current comparison control; voltage comparison control; two 12-bit ADC's; two variable gain amplifiers; and two sample and hold circuits.

The measure circuitry is primarily comprised of two distinct measurement circuits. With these two circuits, both voltage and current can be measured simultaneously. The voltage to be measured is derived from the output of the sense line buffer into a variable gain amplifier and then into the sample and hold circuit. Correspondingly, the current measurement is derived from the resulting voltage drop across the ranging resistors, which is also fed into a variable gain amplifier. The gain of these amplifiers is controlled by the respective range control circuitry included in the forcing circuitry. The measurements are in the same ranges that have been programmed into the forcing circuitry.

There are two sets of limit registers included in the two separate measurement circuits. Each set has a high and a low comparison register. Each of these registers can be programmed to compare against either less than, greater than, or neither (masked). With the values that can be programmed into magnitude for comparison and the parameters that can be programmed to compare against, the window of the comparison can be almost any shape or value. For example, any or all of the limits can be masked. Also, any comparison register can hold any value in the range dictated by the forcing circuitry. Further, comparisons can mean either pass or fail.

When loading calibrated values for each active digital-to-analog converter (DAC), the test head controller 12 employs a dedicated calibration processor. With this configuration, an accurate measured value or indication is attained by first parallel loading a selected DAC register with an uncalibrated start value. Next, all test associated DAC registers are incremented to the force valve. As the voltage at any pin crosses a preset compare level, the contents of the DAC register are latched.

The test is completed after all participating pins have crossed the pass/fail boundary. At this time a read of stored values by the dedicated calibration processor can return accurate measured values.

The measure control block supplies the proper signals to control all of the states of the sample and hold and the ADC. Primarily, the sample and hold receives a 5 $\mu$s pulse for the sample mode, and then three 500 ns pulses are generated to control the synchronous strobing of the data to be compared, start conversion pulse, and a 500 ns delay period, respectively. The measure control block also AND's the complete status bits together to signal the remainder of the measure control circuitry after both of the conversions are completed. The measure control block starts its sequence by either having the START or the MEAS signals go active.

When the measurement conversions are complete, the pass/fail control block and the measure mode control block determine what response, if any, to send back to the interface bus 24. If a measurement mode is in effect, then when the conversions are complete, the ADC/signal goes active, indicating to the test head controller 12 that the measurement cycle is complete and the measure DATA is ready to be read. If the analog settling analysis mode is in effect, then the measure mode control and the pass/fail control circuitry determine if the comparison criteria had been met to stop the measurement or not. If the criteria had been met, then the resulting ADC/ signal to the interface bus 24 signals the test head controller 12 that the test is complete. This can signify either a pass or a fail. In the last case of measurement modes, the go/no-go measurement mode, the sequence is the same as in the measurement mode, but the ADC/ sent to the interface bus 24 indicates a pass or a fail.

A measurement requires just one measurement with no comparison. A go/no-go measurement requires one measurement with comparisons determining the results. An analog settling analysis takes multiple measurements until a comparison limit is reached or a time out occurs.

The following is a brief description of how the relays included in the PMU 20 react to stimulus. The DMV relays are normally open and close when the system measurement unit 26 is to make a voltage measurement on the PMU 20. The output relay is normally open and must be closed to connect the PMU 20 to the relay matrix 22. The high Z relay is a normally closed relay and must be opened to make a high Z measurement. The Kelvin check relay is a normally open relay and must be closed to force the Kelvin alarm circuitry to activate. The Kelvin alarm circuitry is activated when approximately 2 V exists across the diodes in the force and sense lines. Of the last two relays, there is a normally closed relay that is normally closed on the DGS reference and a normally open relay that is closed on DPSENSE when in the opposite state. That is, when DPSENSE is selected, the relay contact K7 is closed, and the relay contact K6 is open. To select DGS, the opposite is the case.

The calibration of the PMU 20 is accomplished through the use of the system measurement unit 26 and calibration standard circuit 28. The PMU 20 is connected to precision load resistors via a calibration bus (not shown). The precision load resistors are voltage sensed by the system measurement unit 26. As the PMU 20 forces voltages to the load resistors, the system measurement unit 26 measures the values. It is these values that are acted upon by the calibration program. The same procedure is used to calibrate the current forcing mode of the PMU 20. It is therefore noted that the accuracy of the calibrated PMU 20 is determined by the calibration accuracy of the system measurement unit 26.

In the fastest settling time (27 μs), the current ranges are between the 256 mA and the 2 mA ranges. The next settling time is the 1 ms range, and the current ranges are between the 256 mA and 16 μA ranges. The next settling time is 10 ms, and the current ranges are within the 256 mA and the 2 μA ranges. The last settling time is 100 ms, and the current ranges are 256 mA to 500 nA ranges. The 27 μs range is hardwired, but the other three ranges are programmable, with their corresponding bits in the relay control register. These values are based on 250 picofarads (pf) for the cable capacitance, 200 pf for the DUT/mother board interconnect, and up to 1000 pf added capacitance to the DUT.

A guarded Kelvin connect path from each PMU 20 to the pin electronics interface circuits 34 is provided by the low-leakage relay matrix 22. The connection path to the DUT is preferably restricted to a modulo 2 or modulo 4 pin connection (i.e., PMU 0 to pins 0, 4, 8, 12 . . . , PMU 1 to pins 1, 5, 9, 13 . . . , etc.) when two or four PMU's 20 are installed.

The pin electronics interface circuits 34 include the connect relays for the PMU 20. The connect relays are used to connect the PMU 20 to the DUT pin. The PMU 20 driven guard terminates on the pin electronics interface circuit board at the connect relays. The Kelvin force to sense is terminated by one of the relays.

In operation, the voltage of the digitally programmed source included in the PMU 20 is gated on to pre-condition or pre-charge the capacitance of the testing circuit. Then the digitally programmed source included in the PMU 20 is connected to the DUT. Only then is the current of the digitally programmed source included in the PMU 20 gated on. This provides a minimum disturbance connection to the DUT.

Setting the Forcing and Settling Conditions

This elemental specifies voltage and current values and time parameters that determine the PMU static and dynamic operating characteristics for a subsequent static test.

| PMU-CONDITIONS | (V-FORCE: | VOLTS; |
| --- | --- | --- |
| | V-RANGE: | V-RNG-TYPE; |
| | I-FORCE: | AMPS; |
| | I-RANGE: | I-RNG-TYPE; |
| | V-CONNECT: | VOLTS; |
| | USER-DELAY: | DELAY-SECONDS |
| | ROLL-OFF: | COMPENSATION-TYPE); |

V-FORCE is the signed value of the intended PMU operating voltage rail or voltage compliance for current rail operation. This value will be the intended voltage condition of test for a subsequent measurement or in conjunction with the I-FORCE value will determine the maximum power the PMU will deliver to, or drain from, a connected DUT load.

V-RANGE is either R128V, R64V, R32V, R16V, R8V, R4V, R2V, R1V, or BEST-FIT-V. This is the PMU voltage range for forcing and measurements.

I-FORCE is the signed value of the intended PMU operating current rail or a current compliance limit. This value will be the intended current condition of test for a subsequent PMU measurement or in conjunction with the V-FORCE value and a hardware current limit of equal value in the opposite quadrant to the one programmed, will determine a PMU power compliance limit for a connected DUT load.

I-RANGE is either R256MA, R128MA, R64MA, R32MA, R16MA, R8MA, R4MA, R2MA, R1MA, R512UA, R265UA, R128UA, R64UA, R32UA, R16UA, R8UA, R4UA, R2UA, R1UA, or R.5UA. This is the PMU current range for forcing and measurements.

V-CONNECT is the user specified voltage to pre-charge the PMU connection path to before connection to the DUT. This voltage level must be within the V-

RANGE and provide a connect condition to assure minimum disturbance of the DUT and a dry relay switch current when final connection to the DUT is made.

USER-DELAY is a user defined delay to wait after the PMU is gated on for a measurement. This delay is to provide adequate time for the PMU to settle to a final operating point before a GO-NO or RETURN-VALUE measurement is made. In the SMART settling type of test, the USER-DELAY specifies the maximum expected time for a worst case load to settle to a stable pass operating point. The programmed compensation, load, load capacitance, V-RANGE, I-RANGE, and desired accuracy of test are some factors that will determine the correct test settling time for the user to program.

ROLL-OFF is either NULL-COMP, COMP1, COMP2, or COMP3. The load capacitance in conjunction with the I-RANGE in use determines the roll off compensation to program. Generally the minimum roll off allowed for the I-RANGE is desirable to improve test throughput, but use of a marginal ROLL-OFF for the capacitive load expected may result in PMU oscillation.

Whenever the PMUPP range or resolution capabilities do not provide the desired test conditions, the PMU(s) should be used for static parameter measurements. The user can determine the minimum acceptable delay to use empirically during test plan debug by iteration of the USER-DELAY argument and tracking the measured value results. Changes of the performance board connections can cause changes in load capacity that may require adjustment of delay. Worst case delay estimates are provided in a tabular form in the product description.

This elemental loads values to VTR and should precede a companion PMU-LIMITS elemental to provide necessary range checking. The values that are arguments of this elemental procedure are transferred to test hardware with the PMU-MEASURE execution elemental.

Specifying the Connection To Be Used

This elemental controls the connection path for subsequent PMU measurements.

| PMU-CONNECT | (PMU-REF: NUM-PMUS: FORCE: | PMU-REFERENCE-TYPE; NUM-PMUS-TYPE; PMU-FORCE-TYPE); |
|---|---|---|

PMU-REF is either DPS0, DPS1, DPS2, DPS3, DPS4, DPS5, or DGS. This argument defines the PMU reference as one of the DPS's or its default reference of Device Ground Sense.

NUM-PMUS is either ALL-PMUS or ONE-PMU. Where DUT test requirements demand a single PMU measurement be conducted at a time, the user may define ONE-PMU or use a default of ALL-PMUS and define a single pin PINGRP in the execution elemental.

FORCE is either FORCE-AND-MEASURE or V-MEASURE-ONLY. This argument allows the PMU(s) to be used as a high impedance voltmeter instead of its normal application as a combined forcing and measuring device.

It is presumed that most PMU measurements will be performed using DGS as reference, ALL-PMUS, FAST-MATRIX, and FORCE-AND-MEASURE. This combination of arguments is therefore the default state at START time. If the user needs a change during test execution, he must invoke PMU-CONNECT prior to executing a measurement.

This elemental only loads virtual test resource values and must precede a companion PMU-MEASURE execution elemental if a change in default connect conditions is required. Restrictions, if any, when using a reference other than DGS are TBD. There may be some increase in required settling time, and accuracy of force and measure will be relative to the accuracy of the DPS used as a reference.

Defining the Pass Window Current Limits

This elemental establishes a go/no-go current limit window for a subsequent PMU measurement. PMU-I-LIMITS (I-MAX, I-MIN: AMPS);
I-MAX is the upper current window limit.
I-MIN is the lower current window limit.

PMU-I-LIMITS define a current limit window for PMU static test. The defined values must be within the range specified in the PMU-CONDITIONS elemental last executed. When this elemental is used, the condition of static test intended is assumed to be on the voltage rail defined in PMU-CONDITIONS, and a one percent tolerance voltage limit window around the programmed voltage force value is automatically set by software. Thus, a PMU measurement that is strobed before analog settling of the PMU on the programmed voltage rail occurs will result in a fail decision. In this case the fail indicates the intended test conditions (voltage rail operation) were not met at the time the PMU sampled the voltage and current for an analog to digital conversion. A fail would also result if the PMU had settled on the voltage rail outside the defined current window pass limits. The latter case would be an out of limit test fail result.

I-MAX and I-MIN must be within the I-RNG programmed in the preceding PMU-CONDITIONS elemental. This elemental only loads VTR values and must precede a companion PMU-MEASURE execution elemental.

Specifying the Pass Conditions

This elemental is used to establish a bounded pass area for a subsequent PMU-MEASURE.

| PMU-LIMITS | (V-MAX, V-MIN: I-MAX, I-MIN: | VOLTS; AMPS); |
|---|---|---|

V-MAX and V-MIN are the maximum and minimum voltage bounds of a pass area.
I-MAX and I-MIN are the maximum and minimum current bounds of a pass area.

This elemental is used when the user wants to define a PMU pass area that includes a voltage-current crossover corner of the PMU operating characteristic. For instance, a ten percent tolerance one kilo ohm resistor load to ground would have a pass area within ten percent of the crossover corner of a programmed one volt, one milliamp PMU operating characteristic.

Another possible reason to use the PMU-LIMITS instead of a PMU-I-LIMITS or PMU-V-LIMITS elemental is to change the default one percent tolerance applied by software on either side of the intended operating rail. Increasing the tolerance beyond one percent may allow faster measurements when the DUT static parameter to be measured has a minimal change near the desired condition of test. Decreasing the tolerance may require longer settling times but may be necessary to attain the desired accuracy of measurement.

Limit values must be within the ranges defined in a previously executed PMU-CONDITIONS elemental. This elemental only updates VTR values and must be executed prior to a companion PMU-MEASURE execution elemental.

Performing the Measurement

This is the execution elemental for a PMU measurement. It automatically sequences the PMU through a pin list doing the predefined measurement sequence and returns a pass/fail decision and/or measured values.

| PMU-MEASURE | (PIN-GROUP: | PIN-GRP); |
|---|---|---|
| | MEASURE- | MEASURE- |
| | METHOD: | METHOD-TYPE; |

PIN-GROUP is a user defined pin group to be measured.

MEASURE-METHOD is either GO-NO, SMART, or RETURN-VALUE.

The basic PMU measurement sequence initiated for the GO-NO and RETURN-VALUE options is as follows. The relay matrix path to the Pin Electronic channel(s) to be measured is closed, predefined force and limit values, are loaded and compensation and delay registers are loaded. Before final connection to the DUT, the PMU is gated on forcing the connect voltage to precharge the connection path, then the current is gated off and the final Pin Electronic relay(s) is closed to connect to the DUT. The PMU Kelvin alarm is enabled by the elemental at this point in the sequence, and an abnormal test plan termination will result if a hardware fault is detected that prohibits a Kelvin condition. The voltage forcing value is loaded, and the PMU is gated on in current and voltage. The user defined delay timer countdown is initiated as any connected Pin Electronic driver or load circuits are relay disconnected to transfer the DUT load to the PMU. When the delay count down completes, sample and hold circuits are strobed to store voltage and current node values, and the PMU's Analog to Digital Conversion (ADC) hardware is activated. Within 30 µs the digitized voltage and current ADC results are available for comparison to the preloaded limits. For a GO-NO measure method the digital compare result is a pass/fail decision. When a RETURN-VALUE measure method is defined, voltage, current, and the compare result are stored in the global arrays RESULT-VOLTS, RESULT-AMPS, AND RESULT-BOOLEAN respectively for the pins being measured. Once the PMU noted values have been sampled, while the ADC is digitizing, the PMU is programmed to the connect voltage, and after a minimal delay to settle, current is gated off. Pin electronic relays previously opened are closed. At this point, a fail decision at any pin(s) may abort the rest of the pin list without measurement unless the fail branch has been overridden. For a pass decision, the elemental continues through the pin list, or when the defined PIN-GROUP has successfully completed measurement the elemental relinquishes control to allow test plan continuation. For the SMART measure method, the ADC begins a continuous conversion process when the voltage and current are gated on. This ADC operation continues until the digitized results indicate an operating point within the pass area or the delay timer count down is completed. Any pass digitized result will allow the sequence to continue producing an optimum rate test sequence. If the delay countdown completes before a pass condition is digitized, the SMART measure method returns a fail result. This option provides an optimum test rate for low current tests that normally require long settling times. In this case the user should define a maximum allowable test time considering the current range, load capacity, compensation type, and expected accuracy. With other measure methods, the delay programmed will usually be trimmed to the minimum acceptable value that will result in the degree of accuracy required. For the SMART option, the delay programmed is the maximum time to settle under worst case conditions. When using the SMART option, test fail will require more test time than a pass which can proceed at optimum rate.

All necessary PMU program parameters are defined by prior PMU-CONDITIONS, PMU-CONNECT, and PMU-I-LIMITS or PMU-LIMITS or PMU-V-LIMITS elementals. The PMU-MEASURE places stored VTR values in hardware registers in the proper sequence to perform the desired test.

Hardware faults that prevent a Kelvin connection may cause abnormal termination of the test plan. Before normal testing can resume, the hardware fault must be corrected.

Specifying the Pass Window Voltage Limit

This elemental establishes a go/no-go voltage limit window on the programmed current rail for a subsequent PMU measurement.

PMU-V-LIMITS (V-MAX, V-MIN: VOLTS);

V-MAX is the upper voltage window limit.
V-MIN is the lower voltage window limit.

PMU-V-LIMITS define a voltage limit window for PMU static test. The defined values must be within the range specified in the PMU-CONDITIONS elemental last executed. When this elemental is used, the condition of the static test intended is assumed to be on the current rail defined in PMU-CONDITIONS and a one percent tolerance current limit window around the programmed current force value is automatically set by software. Thus a PMU measurement, that is strobed before analog settling of the PMU on the programmed current rail occurs, will result in a fail decision. In this case, the fail indicates the intended test conditions (current rail operation within one percent of programmed range) were not met at the time the PMU sampled the current for an analog to digital conversion. A fail would also result if the PMU had settled on the current rail condition of test outside the defined voltage window pass limits. The latter case would be an out of test limit fail result. If the user wishes other than a one percent current tolerance, PMU-LIMITS should be used.

V-MAX and V-MIN must be within the V-RNG programmed in the PMU-CONDITIONS elemental preceding. This elemental only loads values to a VTR and must precede a companion PMU-MEASURE execution elemental.

FIG. 5 shows the voltage-current capability of each PMU 20. If the current drawn by the load attempts to exceed the programmed value, the PMU 20 becomes a constant current source at the programmed value. Otherwise, the PMU 20 operates as a constant voltage source. The programmed voltage and current ranges are shown in Table II below. Each PMU 20 is capable of operating in one of two modes as follows: mode 1 (FIG. 5): ±100 V at ±128 mA (four quadrants) and mode 2 (FIG. 5): ±8 V at ±256 mA (four quadrants). The preferred voltage and current ranges of each PMU 20 are as follows:

TABLE II

PMU VOLTAGE SPECIFICATION

| Range | Full Scale (compliance) | Resolution Forced 13 bits + sign | Resolution Measured 11 bits + sign |
|---|---|---|---|
| 1 V | 1.049 V | 128 μV | 512 μV |
| 2 V | 2.097 V | 256 μV | 1.024 mV |
| 4 V | 4.194 V | 512 μV | 2.048 mV |
| 8 V | 8.389 V | 1.024 mV | 4.098 mV |
| 16 V | 16.777 V | 2.048 mV | 8.192 mV |
| 32 V | 33.554 V | 4.096 mV | 16.384 mV |
| 64 V | 67.109 V | 8.192 mV | 32.768 mV |
| 128 V | 134.218 V (100 V max) | 16.384 mV | 65.536 mV |

PMU CURRENT SPECIFICATION

| Range | Full Scale (compliance) | Resolution Forced 14 bits + sign | Resolution Measured 11 bits + sign |
|---|---|---|---|
| 0.5 μA | 0.512 μA | 250 pA | 250 pA |
| 1 μA | 1.024 μA | 250 pA | 500 pA |
| 2 μA | 2.048 μA | 250 pA | 1 nA |
| 4 μA | 4.096 μA | 250 pA | 2 nA |
| 8 μA | 8.192 μA | 500 pA | 4 nA |
| 16 μA | 16.384 μA | 1 nA | 8 nA |
| 32 μA | 32.768 μA | 2 nA | 16 nA |
| 64 μA | 65.536 μA | 4 nA | 32 nA |
| 128 μA | 131.072 μA | 8 nA | 64 nA |
| 256 μA | 262.144 μA | 16 nA | 128 nA |
| 512 μA | 524.288 μA | 32 nA | 256 nA |
| 1 mA | 1.049 mA | 64 nA | 512 nA |
| 2 mA | 2.097 mA | 128 nA | 1.024 nA |
| 4 mA | 4.194 mA | 256 nA | 2.048 μA |
| 8 mA | 8.389 mA | 512 nA | 4.096 μA |
| 16 mA | 16.777 mA | 1.024 nA | 8.192 μA |
| 32 mA | 33.554 mA | 2.048 μA | 16.384 μA |
| 64 mA | 67.109 mA | 4.096 μA | 32.768 μA |
| 128 mA | 132.218 mA | 8.192 μA | 65.536 μA |
| 256 mA | 268.435 mA | 16.394 μA | 131.072 μA |

Accuracy Force/Measure: ± (0.1% value + (1 count or 2.5 mV whichever is greater)).
Accuracy Force/Measure: ± (0.1% value + (1 count or 5 nanoamperes (nA) whichever is greater)).
Slew rate: Voltage force mode, 1 V/microsecond minimum, all ranges.
Low side offset: ±32 V, however, the output of the PMU 20 cannot exceed ± 100 V with respect to ground.

In summary, the PMU 20 is separately gated in current and voltage. Separate gating provides pre-conditioning prior to PMU 20 connection and a smooth transfer of the DUT load to the PMU for a measurement. The PMU 20 includes a digitally programmed source whose idle state (gated off) is preferably forcing zero volts with current rails set at one percent of full scale in the last programmed range. The digitally programmed source included in the PMU 20 is programmed with signed values of voltage and current to define two calibrated operating rails in the intended operating quadrant. An equal valued uncalibrated current rail in the opposite quadrant is automatically set by the circuitry to limit maximum power that can be delivered to the DUT. The connected DUT load determines a stable PMU 20 operating point (typically on the calibrated current or voltage rail) which can be digitized by the on-board ADC's included in the PMU after a programmed settling delay. The dynamic characteristics of the PMU 20 are under program control to optimize test throughput.

PMU 20 force lines can be open circuited by a relay under program control. In this configuration, the PMU 20 sense input can be routed as a high impedance voltmeter probe via the connect paths. The dedicated voltage and current ADC's can digitize measurements and return the values for software use, or compare these values to programmed high and/or low limits which define a pass window to return a direct pass/fail result.

There are three different modes of PMU 20 application. A measured value for subsequent software use or data logging can be obtained by a measure command issued after connection to the DUT, gate-on, and an appropriate time out to settle to a final operating point has expired. The ADC's simultaneously convert the voltage and current values of the PMU 20 operating point. The two's complement ADC result is stored in registers, and an ADC complete signal is sent by the circuitry after the 50-microseconds conversion. The test head controller 12 then reads the registers and provides the values for the exact PMU 20 voltage and current operating point.

The on-board comparison means included in the PMU 20 can be used to indicate a go/no-go decision based on DUT current demand greater than or less than a programmed limit. A go/no-go measurement is made in the same general sequence of events described above for obtaining a numerical result, except calibrated values are loaded into appropriate limit registers prior to issuing a measure command. Typically, only two or three of the four high and low voltage and current limit registers need to be loaded to assure a non-ambiguous go/no-go result. This application mode is faster than obtaining a numerical result since software decalibration of the measured results is not required.

Another go/no-go mode of PMU 20 application to DUT tests is referred to as analog settling analysis. This test has full hardware support and provides the fastest result for tests with long settling times, for example, when a low current is forced. All measurement modes can be used on voltage, current, or voltage and current simultaneously. Analog settling analysis is described more fully in the copending patent application of John Schinabeck and James R. Murdock, entitled METHOD AND APPARATUS FOR MONITORING RESPONSE SIGNALS DURING AUTOMATED TESTING OF ELECTRONIC CIRCUITS, U.S. Ser. No. 06/611,448 filed on the same date as this application and assigned to the same assignee, and the disclosure is hereby incorporated by reference.

The device power supplies 18 are used to provide the DUT bias sources since all functions of the DC subsystem 16 are available to each test head 14. The PMU's 20 of the dedicated DC subsystem 16 can be applied for precision static test conditions and limits when the PMU 20 per pin ranges or accuracies are not acceptable. In either case, all types of static tests can be performed at one test head 14 while another test head is independently executing static or full rate functional tests on another DUT.

The method and apparatus of this invention have several advantages over the techniques of the prior art. Although a preferred embodiment of the method and apparatus of this invention has been described above, it will be apparent to those skilled in the art that numerous variations can be made without departing from the spirit and scope of the invention as defined by the appended claims.

What is claimed is:

1. A method for applying and monitoring a test signal at a node of a device under test including digitally programmed source means having a preselected programmed voltage-current characteristic defined by not-to-exceed voltage rail and current rail levels switchably connected by a first switch means to the node for supplying a test signal to the node and comparison means switchably connected by a second switch means to the node, the method comprising the steps of:

connecting the test signal to the node;

comparing the test signal with a preselected programmed reference level;

providing an indication of the relative magnitude of the test signal with respect to the preselected programmed reference level; and providing a preselected programmed constant signal in the event that the test signal has a predetermined relationship with respect to the programmed reference level.

2. The method of claim 1 wherein the test signal is a forcing function which starts at zero volts and one percent of the maximum current of a preselected voltage-current range.

3. The method of claim 1 wherein the step of comparing the test signal with a preselected programmed reference level comprises comparing the voltage applied to the node with the preselected programmed voltage rail level, the step of providing an indication of the relative magnitude of the test signal with respect to the preselected programmed reference level comprises providing an indication of the relative magnitude of the voltage applied to the node with respect to the voltage rail level, and the step of providing a preselected programmed constant signal in the event that the test signal has a predetermined relationship with respect to the preselected programmed reference level comprises applying the preselected programmed current rail level when the voltage applied to the node reaches the voltage rail level.

4. The method of claim 3 wherein the test signal is a forcing function which starts at zero volts and one percent of the maximum current of a preselected voltage-current range.

5. The method of claim 1 wherein the step of comparing the test signal with a preselected programmed reference level comprises comparing the current at the node with the preselected programmed current rail level, the step of providing an indication of the relative magnitude of the test signal with respect to the preselected programmed reference level comprises providing an indication of the relative magnitude of the current at the node with respect to the current rail level, and the step of providing a preselected programmed constant signal in the event that the test signal has a predetermined relationship with respect to the preselected programmed reference level comprises applying the preselected programmed voltage rail level when the current at the node reaches the current rail level.

6. The method of claim 5 wherein the test signal is a forcing function which starts at zero volts and one percent of the maximum current of a preselected voltage-current range.

7. Apparatus for applying and monitoring a test signal at a node of a device under test, comprising:

digitally programmed source means switchably connected by a first switch means to the node, the digitally programmed source means having a preselected programmed voltage-current characteristic defined by not-to-exceed voltage rail and current rail levels for supplying test signals and alternatively a preselected programmed constant signal to the node; and comparison means connected to the digitally programmed source means and switchably connected by a second switch means to the node for indicating the relative magnitude of the test signal with respect to a preselected programmed reference level;

the digitally programmed source means supplying the test signals unless the test signal applied has a predetermined relationship with respect to the preselected programmed reference level;

the digitally programmed source means supplying the preselected programmed constant signal in the event that the applied test signal has a predetermined relationship with respect to the preselected programmed reference level.

8. Apparatus as in claim 7 wherein the digitally programmed source means is a crossover source which supplies a test signal in the form of a forcing function that starts at zero volts and one percent of the maximum current of a preselected voltage-current range.

9. Apparatus as in claim 7 wherein the comparison means compares the voltage applied to the node with the preselected programmed voltage rail level for providing an indication of the relative magnitude of the voltage applied to the node with respect to the voltage rail level; the digitally programmed source means supplying the test signals unless the voltage applied to the node reaches the voltage rail level; the digitally programmed source means supplying the preselected programmed current rail level when the voltage applied to the node reaches the voltage rail level.

10. Apparatus as in claim 9 wherein the digitally programmed source means is a crossover source which supplies a test signal in the form of a forcing function that starts at zero volts and one percent of the maximum current of a preselected voltage-current range.

11. Apparatus as in claim 7 wherein the comparison means compares the current at the node with the preselected programmed current rail level for providing an indication of the relative magnitude of the current at the node with respect to the current rail level; the digitally programmed source means supplying the test signals unless the current at the node reaches the current rail level; the digitally programmed source means supplying the preselected programmed voltage rail level when the current at the node reaches the current rail level.

12. Apparatus as in claim 11 wherein the digitally programmed source means is a crossover source which supplies a test signal in the form of a forcing function that starts at zero volts and one percent of the maximum current of a preselected voltage-current range.

13. Apparatus as in claim 7 wherein the switch means are controlled by a computer means.

14. Apparatus as in claim 13 wherein the switch means comprise reed relays.

15. Apparatus as in claim 14 wherein the computer means comprises a test head controller.

16. Apparatus as in claim 7 wherein the digitally programmed source means is a crossover source.

17. Apparatus as in claim 16 wherein the digitally programmed source means supplies a test signal which is a forcing function that starts at zero volts and one percent of the maximum current of a preselected voltage-current range.

18. A method for monitoring the response signal at a node of a device under test caused by a test signal applied to the node by digitally programmed source means having a preselected programmed voltage-current characteristic defined by not-to-exceed voltage rail and current rail levels switchably connected by a first switch means to the node and comparison means switchably connected by a second switch means to the node, the method comprising the steps of:

connecting the test signal to the node;

comparing the response signal voltage at the node with a first preselected programmed voltage level;

comparing the response signal voltage at the node with a second preselected programmed voltage level;

comparing the response signal current at the node with a first preselected programmed current level;

comparing the response signal current at the node with a second preselected programmed current level;

providing an indication of the relative amplitude of the response signal voltage and current with respect to the first and second preselected programmed voltage levels and first and second preselected programmed current levels, respectively;

providing a pass signal when the response signal voltage and current have a first predetermined relationship with respect to the first and second preselected programmed voltage levels and first and second preselected programmed current levels, respectively; and providing a fail signal when the response signal voltage and current have a second predetermined relationship with respect to the first and second preselected programmed voltage levels and first and second preselected programmed current levels, respectively;

thereby providing a non-ambiguous pass/fail result.

19. The method of claim 18 wherein the test signal is a forcing function which starts at zero volts and one percent of the maximum current of a preselected voltage-current range.

20. Apparatus for monitoring the response signal at a node of a device under test caused by a test signal applied to the node, comprising:

digitally programmed source means switchably connected by a first switch means to the node, the digitally programmed source means having a preselected programmed voltage-current characteristic defined by not-to-exceed voltage rail and current rail levels for supplying test signals to the node;

first comparison means switchably connected by a second switch means to the node for indicating the relative amplitude of the response signal voltage at the node with respect to a first preselected programmed voltage level;

second comparison means switchably connected by the second switch means to the node for indicating the relative amplitude of the response signal voltage at the node with respect to a second preselected programmed voltage level;

third comparison means switchably connected by the second switch means to the node for indicating the relative amplitude of the response signal current at the node with respect to a first preselected programmed current level;

fourth comparison means switchably connected by the second switch means to the node for indicating the relative amplitude of the response signal current at the node with respect to a second preselected programmed current level;

means connected to the comparison means for providing a pass signal when the response signal voltage and current have a first predetermined relationship with respect to the first and second preselected programmed voltage levels and first and second preselected programmed current levels, respectively; and means connected to the comparison means for providing a fail signal when the response signal voltage and current have a second predetermined relationship with respect to the first and second preselected programmed voltage levels and first and second preselected programmed current levels, respectively;

whereby a non-ambiguous pass/fail result is provided.

21. Apparatus as in claim 20 wherein the digitally programmed source means is a crossover source which supplies a test signal in the form of a forcing function that starts at zero volts and one percent of the maximum current of a preselected voltage-current range.

* * * * *